United States Patent
Letertre et al.

(10) Patent No.: US 7,535,115 B2
(45) Date of Patent: May 19, 2009

(54) WAFER AND METHOD OF PRODUCING A SUBSTRATE BY TRANSFER OF A LAYER THAT INCLUDES FOREIGN SPECIES

(75) Inventors: Fabrice Letertre, Grenoble (FR); Yves Mathieu Le Vaillant, Crolles (FR); Eric Jalaguier, Saint Martin d'uriage (FR)

(73) Assignees: S.O.I.Tec Silicon on Insulator Technologies, Bernin (FR); Commissariat a l'Energie Atomique (CEA), Paris (FR)

( * ) Notice: Subject to any disclaimer, the term of this patent is extended or adjusted under 35 U.S.C. 154(b) by 435 days.

(21) Appl. No.: 11/274,264

(22) Filed: Nov. 16, 2005

(65) Prior Publication Data
US 2006/0060922 A1    Mar. 23, 2006

Related U.S. Application Data

(62) Division of application No. 10/678,127, filed on Oct. 6, 2003, now Pat. No. 7,008,859.

(30) Foreign Application Priority Data
Oct. 7, 2002  (FR) .................................. 02 12405

(51) Int. Cl.
*H01L 23/58*  (2006.01)
*H01L 23/544*  (2006.01)

(52) U.S. Cl. .................. 257/798; 257/619; 257/620

(58) Field of Classification Search .................. 257/798, 257/618, 619, 620
See application file for complete search history.

(56) References Cited

U.S. PATENT DOCUMENTS
4,738,934 A  *  4/1988  Johnston et al. ............. 438/508

(Continued)

FOREIGN PATENT DOCUMENTS
EP          505 131 A1      9/1992

(Continued)

OTHER PUBLICATIONS
R. Fornari et al., "Homogeneity of thermally annealed Fe-doped InP wafers," Materials Science and Engineering B44 (1997) 233-237.

(Continued)

*Primary Examiner*—Michael Trinh
(74) *Attorney, Agent, or Firm*—Winston & Strawn LLP

(57) ABSTRACT

A method of producing a substrate that has a transfer crystalline layer transferred from a donor wafer onto a support. The transfer layer can include one or more foreign species to modify its properties. In the preferred embodiment an atomic species is implanted into a zone of the donor wafer that is substantially free of foreign species to form an embrittlement or weakened zone below a bonding face thereof, with the weakened zone and the bonding face delimiting a transfer layer to be transferred. The donor wafer is preferably then bonded at the level of its bonding face to a support. Stresses are then preferably applied to produce a cleavage in the region of the weakened zone to obtain a substrate that includes the support and the transfer layer. Foreign species are preferably diffused into the thickness of the transfer layer prior to implanbumtation or after cleavage to modify the properties of the transfer layer, preferably its electrical or optical properties. The preferred embodiment produces substrates with a thin InP layer rendered semi-insulating by iron diffusion.

16 Claims, 4 Drawing Sheets

U.S. PATENT DOCUMENTS

| | | | | |
|---|---|---|---|---|
| 4,853,077 | A | * 8/1989 | Lambert et al. | 117/17 |
| 5,227,313 | A | 7/1993 | Gluck et al. | 437/2 |
| 5,244,817 | A | 9/1993 | Hawkins et al. | 437/2 |
| 5,270,221 | A | 12/1993 | Garcia et al. | 437/2 |
| 6,867,067 | B2 | 3/2005 | Ghyselen et al. | 438/107 |
| 2002/0185687 | A1 | 12/2002 | Koh et al. | 257/347 |
| 2003/0077885 | A1 | 4/2003 | Aspar et al. | 438/517 |
| 2005/0003229 | A1 | 1/2005 | Bedell et al. | 428/641 |

FOREIGN PATENT DOCUMENTS

WO    WO 02/37556    5/2002

OTHER PUBLICATIONS

E. Jalaguier et al., "Transfer of thin InP films onto silicon substrate by proton implantation process," 11th International Conference on Indium Phosphide and Related Materials (May 1999) 26-27.

A. Näser et al., "Thermal stability of the midgap acceptor rhodium in indium phosphide," Appl. Phys. Lett., vol. 67, No. 4 (1995) 479-481.

* cited by examiner

WAFER AND METHOD OF PRODUCING A SUBSTRATE BY TRANSFER OF A LAYER THAT INCLUDES FOREIGN SPECIES

CROSS-REFERENCE TO RELATED APPLICATIONS

This application is a division of application Ser. No. 10/678,127 filed Oct. 6, 2003, now U.S. Pat. No. 7,008,859, the entire content of which is expressly incorporated by reference thereto.

FIELD OF THE INVENTION

The present invention generally relates to methods of fabricating substrates by stacking and transfer of thin transfer layers of semiconductor materials, and is preferably applicable to monocrystalline layers.

BACKGROUND OF THE INVENTION

A method known as SMART-CUT®, based on implanting atomic species such as hydrogen and/or rare gases and molecular bonding, allows thin films to be produced and assembled on supports. More precisely, implanting atomic species creates a weakened zone and embrittlement in a layer at a depth at which the film is to be detached from a donor wafer. A support or stiffener is attached thereto by molecular bonding. The implanted layer is then transferred by carrying out a treatment, such as a heat or mechanical treatment, to produce cleavage at the weakened zone to detach the transfer layer. The thickness of the thin transfer film is selected in each case, but in general is on the order of a few hundreds or tens of nanometers. The surface obtained can then be polished such as by using a chemical or a mechanical-chemical method. Such a method can produce heterostructures that cannot be obtained by epitaxy alone.

When heat treatments are carried out, such as to facilitate fracture or strengthen the bonding interface, these are conducted at a lower temperature than during epitaxy, and interdiffusion phenomena can be advantageously reduced. This method also allows the remaining portion of the donor wafer left behind after fracturing or detaching, known as the negative, to be recycled, and this is economically beneficial.

In industrial application, the production of a silicon on insulator (SOI) substrate composed of a thin film of monocrystalline silicon electrically insulated from a bulk substrate. In general, the bulk substrate is silicon, and the insulating silicon layer is amorphous silica.

The method is also applicable to a wide range of materials, whether they form the implanted layer (SiC, GaAs, InP, $LiNbO_3$, etc.), the support or stiffener (monocrystalline or polycrystalline silicon, gallium arsenide, polycrystalline indium phosphide, quartz, etc.), or any bonding layer ($SiO_2$, $Si_3N_4$, Pd, etc.).

It is also possible to use the method to produce "partial-substrates" intended to receive an additional layer by epitaxial growth on the transferred thin layer. This can provide several advantages:

size: since some substrates are not available in standard industrial sizes, it is thus possible to carry out a method of transferring a thin layer onto a support or stiffener with a larger diameter. In particular, a 4 inch diameter InP film can be transferred onto a 6 inch diameter support so as to remain compatible with 6 inch standard micro-electronics fabrication facilities;

brittleness: the brittleness of certain bulk substrates (for example InP) can cause the substrates and components to break during fabrication and manipulation and may thereby significantly increase production costs. The layer transfer method can advantageously be employed if a stiffener can provide strength to the structure (for example, a thin InP layer on an Si or GaAs support):

cost: the high cost of certain substrates may justify using a layer transfer method to transfer a very thin layer (a few tens of nanometers thick) onto a cheap stiffening substrate; the operation being repeated after recycling the donor wafer (negative);

compliant effect: this term represents a certain adaptability of the transfer layer, particularly as regards dimensions. In this respect, epitaxial growth is known to require a good match between the lattice parameters and thermal expansion coefficients of the substrate assembly and the epitaxial layer. By way of example, on bulk GaAs substrate it is preferred that, the maximum lattice mismatch not exceed about 1%, otherwise stacking defects typically occur in the epitaxial layer. In one embodiment, techniques can be used that have been developed that allow higher mismatches between the lattice parameters, while making a multilayer structure with an epitaxial seed layer that is sufficiently thin to be able to match itself to the characteristics of the epitaxially grown material by deformation.

It has also to be observed that InP as a substrate for the micro-electronics industry is rapidly gaining popularity. Because of its intrinsic properties, InP and its alloys (InGaAs, AlInAs, InGaP, InGaAsP, InGaAsN, etc.) that can be epitaxially grown thereon with lattice matching, allow transistors to be produced with excellent cutoff and transition frequencies. InP technology is thus the most favorable for producing very high speed optical transmission networks. In optoelectronics, emitters and receivers produced using InP technology can function within wavelength ranges that are used in optical telecommunications. Due to this combination of characteristics, this group of materials can wholly integrate the associated photonic functions and electronic functions of control and amplification in the optoelectronics field. Finally, in the field of microwave amplification, the high power or low noise levels developed by high energy mobility (HEMT) field effect transistors produced using InP technology also contributes to the great success of InP technology.

Currently available substrates formed from InP substrates and the like are bulk substrates obtained by ingot preparation techniques. There are two principal techniques for growth by pulling: liquid encapsulated Czochralski, LEC, and vertical gradient freezing, VGF, as well as a variety of variations and improvements.

The production of large, high quality InP crystals, however, is traditionally fraught with difficulties that involve the crystallization properties of the material. Low twin crystal creation energy and low stacking fault energy promote the appearance of defects in the crystalline structure produced, and the density of these defects has typically increased with ingot size.

Incorporating certain impurities into the melt mixture is also known, either to provide N or P type doping or to render the material semi-insulating, which is accomplished by compensation, preferably with iron. Substrates are sliced from said ingots along the desired crystallographic direction, generally (100) or (111). Subsequent mechanical-chemical polishing produces a finished substrate on which epitaxial growth can be carried out. Growing iron-compensated InP by pulling, however, has typically been happened by a physical property, namely the extremely low segregation coefficient of iron in InP [K(Fe)=10$^{-3}$]. This causes excessive iron incorporation close to the seed as growth commences, followed by depletion of iron in the melt. An iron concentration gradient exists from the head to the tail of the ingot that results in a variation in iron concentration along the ingot. The variation in iron concentration can be as high as one order of magnitude: for example 10$^{16}$ cm$^{-3}$ at one end of the ingot axis and 10$^{17}$ cm$^{-3}$ at the other end. Compensation of the substrate, and thus its resistivity, will vary substantially depending on its original position in the ingot.

To overcome this problem it is possible to proceed to an a posteriori bulk-substrate compensation. A technique for incorporating iron by ion implantation would potentially irreversibly damage the InP material.

It is known that InP can be compensated using a diffusion technique. Generally, sealed quartz tube diffusion is employed at a high temperature (about 900° C.) with a compound that is rich in iron and phosphorus, providing a vapor pressure of several atmospheres. The presence of phosphorus prevents desorption of the phosphorus component of the InP from the substrate surface.

The thickness of bulk substrates typically imposes very long diffusion times (typically at least 80 hours (h) for a 600 micrometer (μm) substrate). Thus, this technique is not readily compatible with mass production using bulk substrates.

Because of the size, brittleness, or cost considerations mentioned above, or to provide the substrate with a characteristics compatible for epitaxy, a skilled person may wish to use a SMART-CUT® type technique to transfer a thin layer of InP onto a support. This technique has been carried out for unintentionally doped InP layers, or those doped with the usual dopants (S, Sn and Zn), or compensated by the presence of iron (see the article by E. Jalaguier et al in Proc 11$^{th}$ Int Conf InP and Related Materials, pp 26-7 (1999)). In the case of semi-insulating InP compensated with iron or another compensating material, undesirable interactions are observed between the implanted species (typically hydrogen) and the complexes present in the material and involving iron atoms. Thus, improvements in these processes are desired.

SUMMARY OF THE INVENTION

The invention relates to a method of producing a product substrate, which comprises providing a donor wafer that is substantially free of foreign atomic species; implanting atomic species into the donor wafer to a preselected depth therein to form a weakened zone below a bonding face of the donor wafer to define a transfer layer between the weakened zone and the bonding face, the weakened zone being configured to facilitate detachment of the transfer layer; bonding the donor wafer at the bonding face to a support; detaching the transfer layer from the donor wafer along the weakened zone to obtain a product substrate that comprises the support and the transfer layer; and diffusing atomic foreign species into the transfer layer, wherein the foreign species is selected to modify at least one of the electrical or optical properties of the transfer layer.

In a preferred embodiment of the method, atomic species are implanted into a donor wafer that is substantially free of a preselected foreign species. Also, in a preferred embodiment, the foreign atomic species are diffused into the transfer layer to a depth smaller than the depth of the implantation. The transfer layer can be thinned after the detaching, if desired, to remove a portion thereof that is substantially free of the foreign species.

Additionally, a bonding layer can be formed on one or both of the bonding faces of the donor wafer and the support to improve the strength of the bonding therebetween. The bonding layer can be configured to form a buried insulator and the product substrate.

The preferred transfer layer is made of a Group III-V semiconductor. Preferably, the foreign atomic species are selected to render the material of the transfer layer semi-insulating once the foreign species are diffused therein. A preferred material for the transfer layer is indium phosphide, and a preferred foreign species includes one or both of iron or rhodium. Thus, the foreign atomic species can comprise a shallow acceptor and a shallow donor. The preferred implanted atomic species comprises at least one of hydrogen ions or rare gas ions, and the material from which the support is made is preferably mechanically stronger than the transfer layer.

Furthermore, an epitaxial layer can be epitaxially grown on the transfer layer of the substrate after the detachment, and the preferred lattice structure of the epitaxial layer is different than that of the transfer layer. The preferred thickness of the transfer layer is less than about 10 μm, and the preferred method of detaching is by applying stress to the weakened zone.

The invention also relates to a donor wafer for transferring a transfer layer to a support, at least one thin crystalline layer that has a predetermined thickness and comprises a semiconductor material suitable for fabricating a substrate for microelectronics, electronics, optoelectronics, or optics when transferred to a support. A foreign atomic species is diffused into the transfer layer to a depth that is less than the predetermined thickness, and the foreign species is selected to modify at least one of the electrical and optical properties of the transfer layer of the semiconductor material. The transfer layer can have an exposed bonding surface configured for bonding to the support, and the foreign species can be disposed in a region extending from the bonding surface to the depth of the diffusion. Atomic species can be implanted adjacent the transfer layer at the thickness thereof to substantially limit the transfer layer and to facilitate the cleaning of the transfer layer from the remainder of the donor wafer. The preferred materials used in this embodiment are those listed above with respect to the preferred method.

The present invention thus can provide greater uniformity and controllability of the concentration of the diffused foreign species in a controlled location in a produced substrate, and can be obtained without affecting the detaching of the transfer layer from the donor wafer and the formation of the produced substrate.

BRIEF DESCRIPTION OF THE DRAWINGS

Other aspects, objects, and advantages of the present invention will become apparent from the following detailed description of preferred embodiments of the invention, given by way of non-limiting example and made with reference to the accompanying drawings, in which.

DETAILED DESCRIPTION OF THE PREFERRED EMBODIMENTS

Figure 1A:
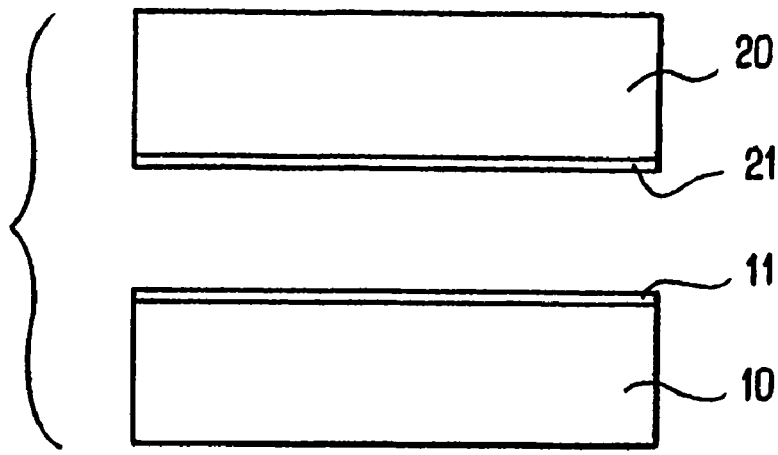
FIGS. 1A-1E show steps of a method in accordance with a first embodiment of the invention.

Although studies have demonstrated the favorable role played by the presence of dopants or impurities in the material on the coalescence kinetics of implanted species prior to cleavage, the Applicant has discovered that iron acts differently, probably by modifying the migration kinetics of hydrogen during implantation then during annealing. This means that the selection of implantation conditions (dose, energy, temperature) and annealing conditions (duration, temperature) becomes much more difficult. Further, the roughness of the free face of the transferred layer following detaching is increased, thus increasing the polishing work and producing a material loss which harms the industrial efficiency and the economics of the method.

To overcome this, in a first aspect, the invention provides a method of producing a substrate comprising a transfer crystalline layer transferred from a donor wafer onto a support. The transfer layer includes one or more foreign species intended to modify its properties. A preferred method comprises the following steps, preferably, in sequence:

implanting atomic species into a zone of the donor wafer that is substantially free of the foreign species to form a weakened zone below a bonding face, the weakened zone and the bonding face delimiting a transfer layer to be transferred;

bonding the donor wafer at the level of its bonding face to a support;

applying stresses in order to produce a cleavage in the region of the weakened zone to obtain a substrate comprising the support and the transfer layer; and diffusing foreign species into the thickness of the transfer layer prior to implantation or after fracture, suited to modify the properties of the transfer layer, preferably its electrical or optical properties.

Certain preferred and non-limiting aspects of this method are as follows:

the step of diffusing foreign species can be carried out after cleavage;

the step of diffusing foreign species can be carried out prior to the implantation;

the step of diffusing foreign species can be carried out to a depth that is smaller than the implantation depth;

the method can include, after cleavage, a thinning step suited to remove the portion of the transferred layer that is depleted in foreign species;

the method can include, prior to bonding, a step of producing a bonding layer on the donor wafer and/or on the support;

the bonding layer can form a buried insulator in the final substrate;

the material of the donor wafer is preferably a III-V semiconductor compound;

the foreign species can include a species that can render the compound semi-insulating by diffusion;

the compound is preferably indium phosphide;

the foreign species can be selected from the group constituted by iron and rhodium;

the foreign species can include a combination of a shallow acceptor such as mercury or cadmium and a shallow donor such as titanium or chromium;

the implanted species can comprise at least one species selected from hydrogen ions and rare gas ions;

the support material is preferably selected to be mechanically stronger than the material of the transfer layer;

the method can include a subsequent epitaxial growth step carried out on the transfer layer of the substrate;

the lattice of the epitaxially grown material can be mismatched with the material of the transfer layer.

In a second aspect, the invention can provide a donor wafer comprising at least one layer of a crystalline material for implementing a method of transferring thin layers of semiconductor material of a predetermined thickness removed from the wafer onto a support for fabricating substrates for microelectronics, optoelectronics or optics. The wafer preferably comprises, on the side of the removal and over a depth that is smaller than said predetermined thickness, at least one diffused foreign species that can modify the properties of the material of said donor wafer.

Preferred and non-limiting aspects of said wafer are as follows:

the material of the wafer can be a III-V semiconductor compound, and the foreign species can be capable of rendering the material of the wafer semi-insulating;

the III-V semiconductor compound is preferably indium phosphide;

the foreign species can be selected from the group comprising iron and rhodium.

The steps of a first embodiment of the invention are described below using as an example a thin layer from an InP donor wafer 20, transferred to a support or stiffener 10 formed from silicon. First, the faces to be bonded to the support 10 and the donor wafer 20 are provided with a bonding layer 11,21 (typically oxide or nitride) to form a hydrophilic surface for molecular bonding (FIG. 1A).

To this end, the donor wafer 20 and the support 10 preferably undergo chemical treatment based on hydrofluoric acid to remove the natural oxide layer. The support 10 is oxidized by thermal oxidation. This technique is particularly suitable for silicon. For InP, however, plasma vapor phase deposition is preferably employed. The bonding layers 11,21 are generally about a few hundred nanometers thick.

Figure 1B:
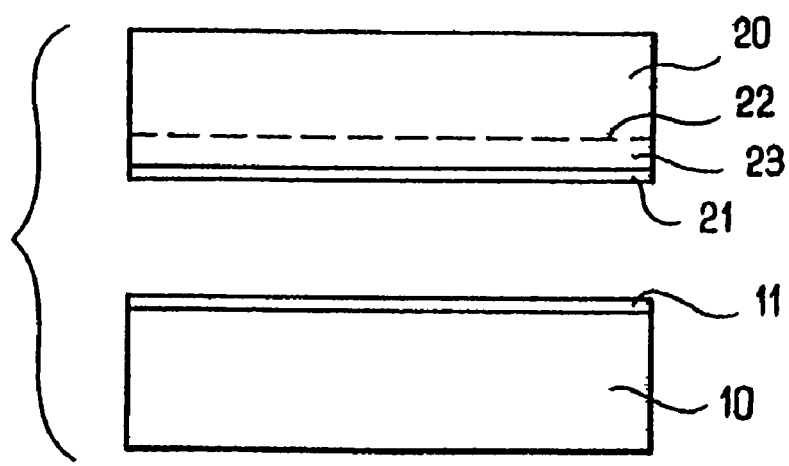

Atomic species implantation is then carried out into the donor wafer 20 at the face provided with the bonding layer 21 to form a generally planar weakened zone 22, which defines a thin layer to be transferred 23 between weakened zone 22 and layer 21 (FIG. 1B). The term "atomic species implantation" as used in the present text means any introduction, preferably by bombardment, of atoms or molecules, which may or may not be grouped, and which may or may not be ionized. This implantation can be carried out, for example, using an ion beam implanter or a plasma immersion implanter. Different types of species can be implanted, such as $H^+$, $H_2^+$, or rare gas ions such as $He^+$. It is also possible to carry out co-implantation with an element such as boron.

Preferably, ionic implantation into the wafer 20 is carried out after heating the wafer 20. The range of temperatures used differs depending on the materials of the wafer 20. In the case of InP, the temperature is preferably in the range between 150° C. to 250° C. The dose used to implant hydrogen ions into that material is preferably in the range $10^{16}$ to $5 \times 10^{17}$ $H^+/cm^2$.

Figure 1C:
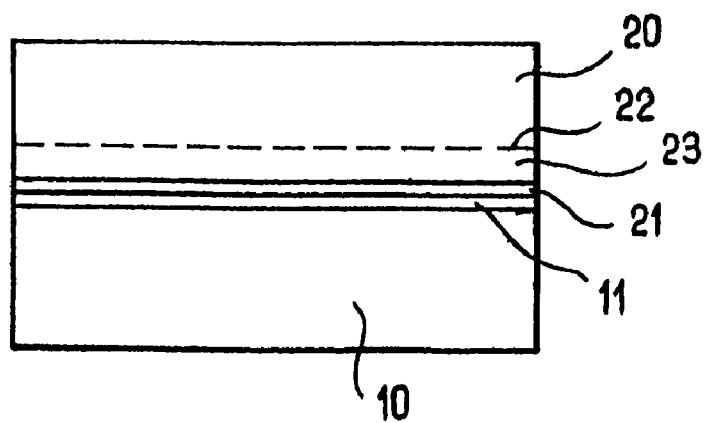

The next step preferably is molecular bonding of the implanted donor wafer and the support at the bonding layers 21,11 (FIG. 1C). This bonding at flat, smooth surfaces in the preferred embodiment. The surfaces can be polished using conventional mechanical-chemical polishing techniques. In the case of hydrophilic type bonding, it is also preferable to increase the surface concentration of molecules terminating in OH that allow bonding. To this end, the donor wafer and support can be immersed in a RCA or SC1 solution ($H_2O$:$H_2O_2$:$NH_4OH$=5:1:0.2-1). It is then dried at a temperature below 90° C. The donor wafer and support are then assembled at ambient temperature under slight pressure, and the assembly is annealed, typically between 250° C. and 400° C. Annealing acts to reinforce bonding at the bonding interface, and also to cause micro-cracks to appear which, on coalescing, start to fracture and detach the InP film along the plane of the weakened zone created by the implanted zone (FIG. 1D).

Figure 1D:
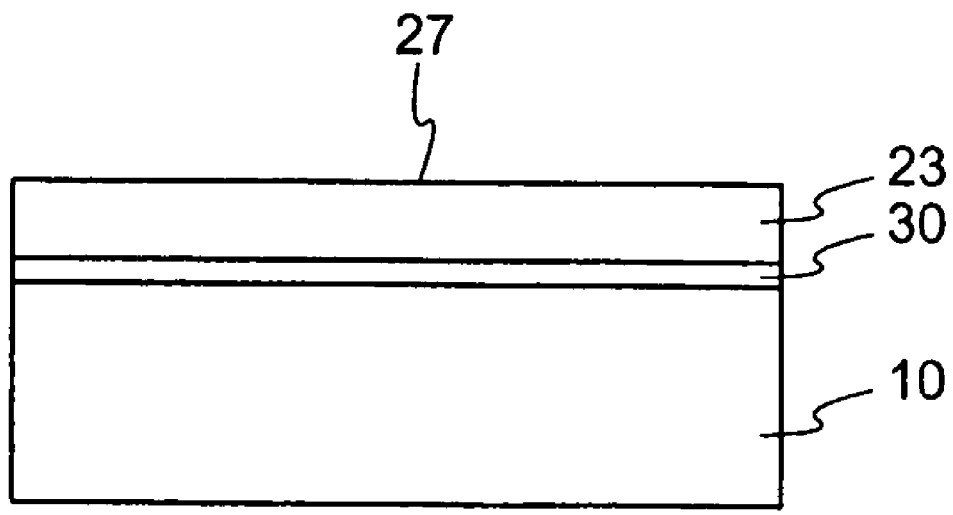

In FIG. 1D, reference number 30 designates the insulating layer substantially formed by the bonded layers 21,11.

Preferably, the surface 27 of the transfer layer that remains exposed is then thinned to remove the superficial implanted zone that is rich in atomic species, such as hydrogen atoms. Different techniques can be used: wet/dry etching and/or mechanical-chemical polishing. A dry etching thinning technique that may prove to be particularly suitable is a spray thinning and smoothing technique.

Figure 1E:
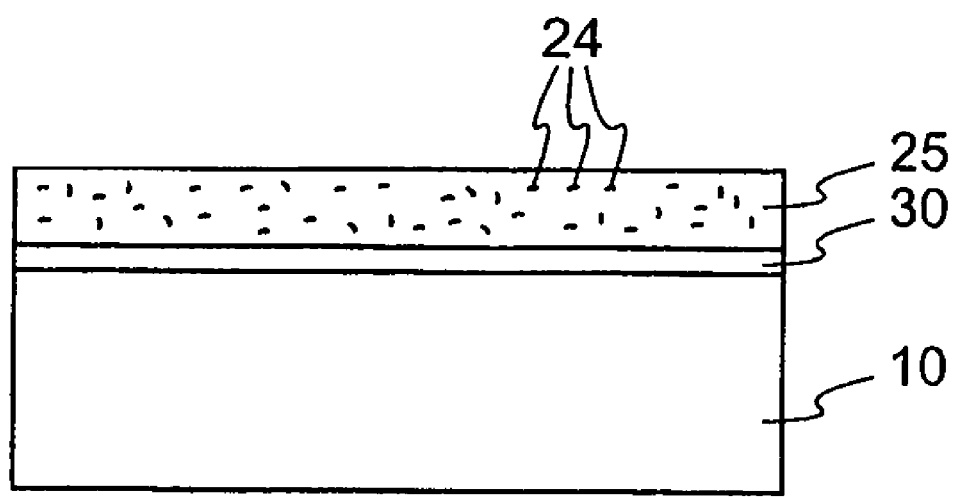

To obtain a semi-insulating layer 25, such as with a resistivity of more than about $10^7$ Ohm.cm, by diffusion of iron 24 therein (FIG. 1E) from the transfer layer of InP 23, the assembled structure is placed in a sealed quartz tube at a high temperature (about 900° C.), in a gas mixture composed of iron and phosphorus (preferably $FeP_2$). The pressure is typically several atmospheres. The diffusion period, which is essentially proportional to the thickness of the InP layer in which the diffusion is to be considered, is estimated to be about ten minutes for a thickness or the order of one micrometer. The preferred $FeP_2$ gas is preferably obtained from high purity iron powder and from red phosphorus in a molar ratio of 1:2. As shown in the drawings, substantially the entire transfer layer is rendered semi-insulating by the diffusion of the foreign atomic species, which is preferably diffused into the transfer layer over substantially its entire surface.

Exposure to the high temperature employed during this diffusion also has an annealing function, which endows the InP material with a semi-insulating nature with an iron concentration that is significantly lower than in the case of a non-annealed material (typically from $10^{15}$ atoms.cm$^2$ instead of $10^{17}$ atoms.cm$^2$, as described by R. Fornari et al. in "Conductivity Conversion of Lightly Fe-doped InP Induced by Thermal Annealing: A Method for Semi-Insulating Material Production", J Appl Phys 81 (11) 1997, pp 7604-11).

In a preferred embodiment, the concentration of the diffused iron is at least enough to provide an effective and sufficient compensating iron in the InP. Additionally, the preferred annealing is carried out at an elevated temperature, typically around 900° C. for several hours, and with a slow cooling, typically around 0.5 to 1° C./minute.

It is considered that this effect derives from a large reduction in shallow donors, which would typically be present in a concentration about $4\times10^{15}$ atoms.cm$^{-3}$. The concentration of shallow donors is related, but not proportionally, to the iron concentration. The reduction of the necessary concentration of iron allows in this case a very high mobility of residual free electrons. Further, the annealing treatment produces a thermal stability that improves the aptitude of the substrate to implantation for the fabrication of devices. Because the atomic species implanted into the material of an InP donor layer are present even though the material is still depleted in iron, the implantation, coalescence, and cleavage phases can be carried out under the good conditions, without the perturbation described above caused by the iron.

In a variation, iron can be diffused from a diffusion source, that is, such as a solid thin film, rich in iron, assembled onto the free face of the transferred layer 23. The assembly is exposed to a heat treatment that encourages diffusion. This method protects the surface of the transfer layer and substantially reduces and preferably prevents any phosphorus desorption.

Treatment of the final surface of the structure comprising the support 10, the intermediate insulating layer 30 and the transfer layer 25 is preferably carried out by spray projection of neutral atoms, such as argon, in clusters to obtain an initial planarization and smoothing of the surface by mechanical and/or mechanical-chemical polishing. The final roughness value, measured in terms of standard deviation, is of the order of a few Angstroms.

The substrate can either be delivered as is to the component industry destination for epitaxial growth over the transfer layer 25, thus forming a growth seed. The substrate can otherwise be provided with an epitaxially grown layer following the sequence of steps described above. The preparation required for epitaxy can include a step of stabilizing the surface oxide and using tensioactives to provide the surface with a hydrophilic nature.

Figure 2A:
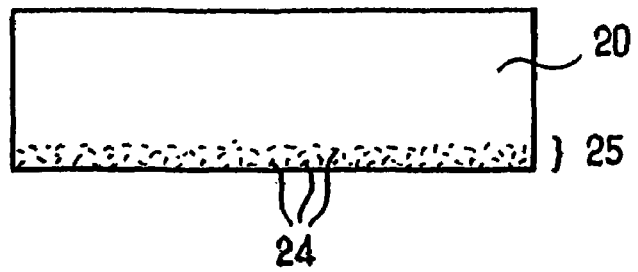
FIGS. 2A-2F show steps of a method in accordance with a second embodiment of the invention.
Figure 2B:
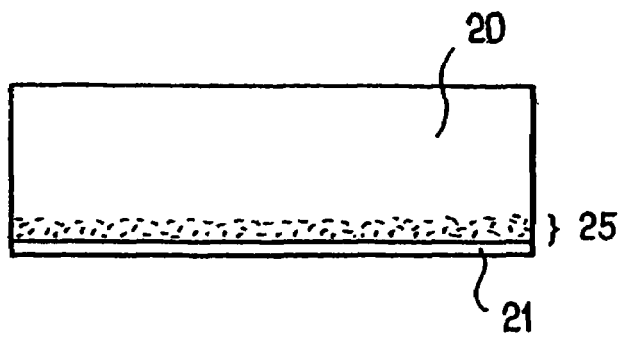
Figure 2C:
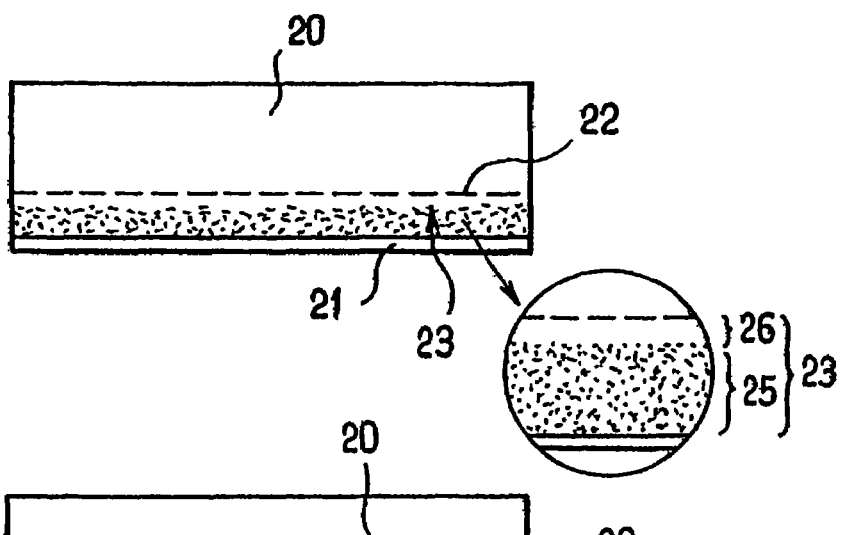
Figure 2D:
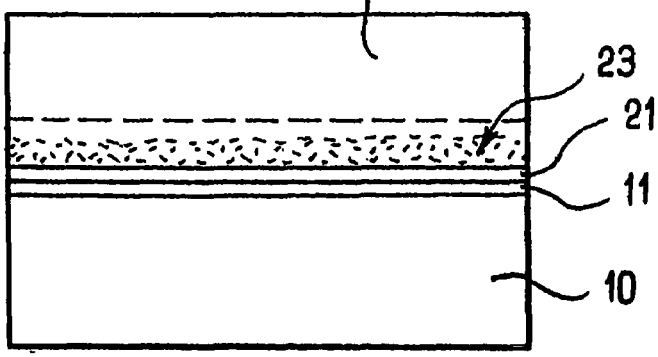

Referring to FIGS. 2A-2F, in a preferred embodiment, iron is diffused into the donor wafer 20 (FIG. 2A), but in a shallow depth layer 25. More precisely, the depth of layer 25 is preferably smaller than the depth to which the atoms will subsequently be implanted to form the weakened zone (FIG. 2C). FIG. 2B shows the intermediate production of the bonding layer 21, and FIG. 2D illustrates the bonding step.

Figure 2E:
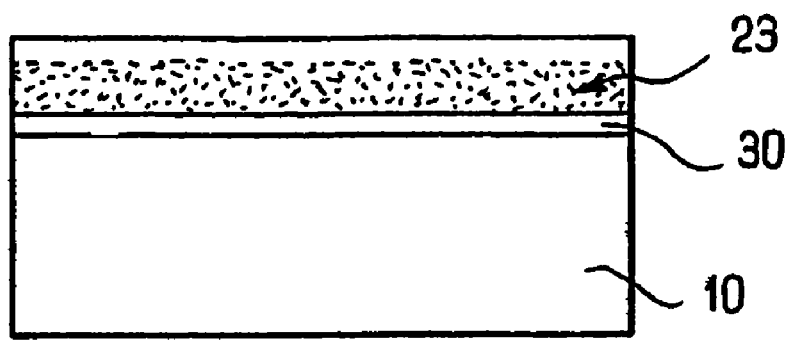
Figure 2F:
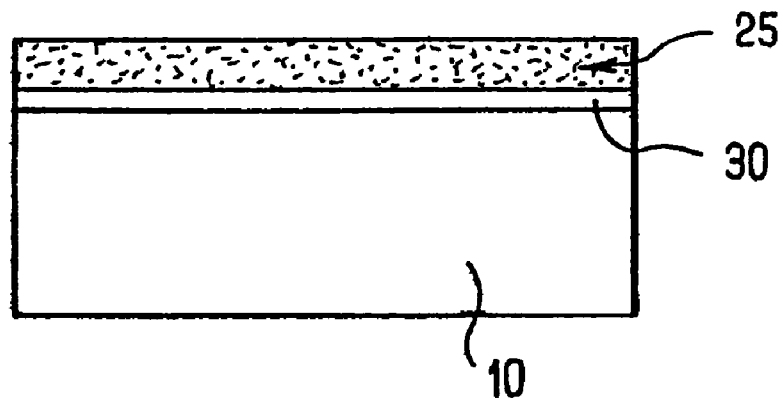

Migration of the implanted species can result in fracture and detaching from the donor wafer 20 of a transfer layer 23 comprising the layer 25 that has received iron diffusion and a layer 26 in which iron is substantially absent (FIG. 2E). Since the migration occurs in a zone in which iron atoms are absent or at least sufficiently rare so as substantially not to perturb the migration and the resulting coalescence, the cleavage can occur in a region with favorable conditions.

This embodiment is advantageous in that it preferably avoids the high temperature annealing required to diffuse iron into a multi-layer structure. Differences between the thermal expansion coefficients are susceptible of generating very high stresses. By exposing a bulk (non composite) substrate to a high temperature for diffusion, expansion of the substrate does not generate the shear stresses. Hence, prior to the surface treatment, the structure illustrated in FIG. 2E is obtained, with a zone 26 of the transfer layer that is substantially free of iron and a zone 25 containing diffused iron, adjacent to the buried insulating zone 30. The depth of the implanted zone 22 with respect to the thickness of the zone 25 is selected so that subsequent thinning can completely remove zone 26, and if necessary a small fraction of the zone 25, to obtain a final transfer layer 25 that is homogeneously iron compensated throughout its thickness.

A number of variations of the invention are possible. For instance, the diffused material can be any material incorporated into a transfer layer before or after transfer to the support substrate, to modify the physical, chemical or electrical properties thereof, and which counters migration of the implanted species during the implantation step. In this respect, although iron is currently the only element used on an industrial scale to render InP semi-insulating, compensation elements with a lower diffusivity than iron—to limit contamination of other parts of the structure by iron and the risk of iron depletion—could also be used.

In this regard, as indicated in the article by A. Näser et al, "Thermal Stability of the Mid-gap Acceptor Rhodium in Indium Phosphide", Appl. Phys. Lett., 67, 479-481 (1995), rhodium is known to be a deep acceptor in InP (dual activation energy of 620 milli electron-volts (meV) and 710 meV) that is thermally very stable to diffusion in InP. While rhodium may prove to be problematic in use for bulk InP substrates as it cannot compensate all of their volume, it becomes practical with a transfer layer of transferred InP in accordance with the present invention. Typically, according to the study by A. Näser et al cited above, the dose of rhodium would be about $1\times10^{17}$ atoms.cm$^{-3}$ to a depth of 250 nm.

InP compensation can also be achieved using a combination of elements, for example a shallow acceptor, such as Hg or Cd, combined with a deep acceptor, such as Ti or Cr. Resistivities of $10^4$ to $10^5$ ohm.cm are obtained. Mercury and titanium have the advantage of having a much lower diffusivity than iron and could limit contamination of neighboring parts of the structure that is produced.

In conclusion, the present invention can produce a structure that has:

a transfer film of InP with diffused Fe;

an optional amorphous bonding layer ($SiO_2$, $Si_3N_4$, etc.); and a support, for example monocrystalline, polycrystalline Si, etc. while using a thin film transfer method without perturbation by iron.

In one embodiment, by selecting non-doped InP, transfer of a thin InP film using a layer transfer method, such as SMART-CUT®, is facilitated. Further, iron diffusion of InP in a gas source, since it is carried out at a very high temperature (about 900° C. or more), improves homogeneity of iron distribution, compensation efficiency (resistivity/iron concentration ratio), and consequently improves the mobility of residual free electrons.

Since the diffusion step is carried out in a thin film of low thickness, preferably less than about 10 µm, more preferably less than about 5 µm, still more preferably less than about 2 µm, and most preferably between about 1.5 µm and 0.5 µm, the duration of this step is typically a few minutes, i.e., about two orders of magnitude shorter than diffusion into a bulk substrate, preferably less than about 10 minutes, and most preferably less than about 8 minutes, which takes an economically prohibitive length of time for most industrial applications. In one embodiment, the preferred thickness of the thin film in which the diffusion takes places is around 1 µm. The present method is thus compatible with industrial application.

With regards to size, since the maximum diameter of InP wafers is currently 100 mm based on commercially available material, they can be transferred to a larger diameter support. Thus, these partial-substrates can subsequently be used in fabrication facilities for larger standards. As an example, it becomes possible to use certain GaAs technology equipment for which the standard substrate size: 150 mm with the partial substrates.

Furthermore, compared with a bulk substrate, the support, for example made of Si, of the structure results in increased strength. This advantage leads to a reduction in losses during transport, manipulation and fabrication of components and circuits.

Finally, depending on the transition layer employed, the invention can produce a partial substrate with a compliant character for epitaxy because of the very thin InP layer. This means that epitaxial growth of a material with a lattice mismatch of 1% or more and/or with a thermal expansion coefficient that differs from that of InP can be facilitated.

The present invention is applicable to all materials that may contain foreign elements perturbing coalescence of the implanted species necessary for a layer transfer method such as SMART-CUT®. It is not limited to the embodiments described and shown herein. While illustrative embodiments of the invention are disclosed, it will be appreciated that numerous methods and other embodiments may be devised by those skilled in the art. Therefore, it will be understood that the appended claims are intended to cover all such modifications and embodiments that come within the spirit and scope of the present invention.

What is claimed is:

1. A donor wafer for transferring a layer therefrom to a support, the donor wafer having a top surface and comprising:
a zone of weakness present therein at a preselected depth;
at least one transfer layer of a crystalline material that has a predetermined thickness and comprises a semiconductor material suitable for fabricating a substrate for microelectronics, optoelectronics or optics when transferred to the support; wherein the transfer layer is defined between the top surface and zone of weakness of the donor wafer; and
foreign atomic species present in and completely throughout the transfer layer at a depth that is within the predetermined thickness of the transfer layer and above and not in contact with the zone of weakness;
wherein the foreign atomic species is selected to modify at least one of the electrical or optical properties of the transfer layer to render the transfer layer to be semi-insulating.

2. The donor wafer of claim 1, wherein the top surface of the donor wafer forms an exposed bonding surface for the transfer layer, which surface is configured for bonding to the support, and the foreign atomic species is diposed from the bonding surface to the depth.

3. The donor wafer of claim 1, wherein the zone of weakness is formed by implanting of atomic species that facilitate detachment of the transfer film from the donor wafer.

4. The donor wafer of claim 1, wherein the semiconductor material is a Group III-V semiconductor.

5. The donor wafer of claim 1, wherein the semiconductor material is indium phosphide.

6. The donor wafer of claim 1, wherein the foreign atomic species comprises at least one of iron or rhodium.

7. The donor wafer of claim 3, wherein the implanted atomic species that forms the weakened zone comprises at least one of hydrogen ions and helium ions, or both.

8. The donor wafer of claim 1, wherein the transfer layer is bonded to a support, wherein the support is made of material is mechanically stronger than that of the transfer layer.

9. The donor wafer of claim 1, which further comprises a bonding layer upon the transfer layer.

10. The donor wafer of claim 9, wherein the bonding layer is amorphous.

11. The donor wafer of claim 9, wherein the bonding layer is $SiO_2$ or $Si_3N_4$.

12. The donor wafer of claim 1 further comprising a support wherein the transfer layer is bonded to a support.

13. The donor wafer of claim 12 wherein the support is monocrystalline or polycrystalline Si.

14. The donor wafer of claim 9 further comprising a support, wherein the bonding layer of the transfer layer is bonded to the support.

15. The donor wafer of claim 14, wherein the support is monocrystalline or polycrystalline Si.

16. The donor wafer of claim 1, wherein the foreign atomic species comprises a shallow acceptor of mercury or cadmium and a shallow donor of titanium or chromium.

* * * * *

UNITED STATES PATENT AND TRADEMARK OFFICE
CERTIFICATE OF CORRECTION

PATENT NO. : 7,535,115 B2
APPLICATION NO. : 11/274264
DATED : May 19, 2009
INVENTOR(S) : Letertre et al.

It is certified that error appears in the above-identified patent and that said Letters Patent is hereby corrected as shown below:

Title Page:
Item (57) ABSTRACT, line 15, change "implanbumtation" to -- implantation --.

Column 10:
Line 12 (claim 1, line 8), change "support;" to -- support, --.
Line 21 (claim 1, line 17), change "transfer layer to render" to -- transfer layer or to render --.
Line 26 (claim 2, line 4), change "diposed" to -- disposed --.
Line 41 (claim 8, line 2), change "is made of material" to -- is made of a material that --.
Line 50 (claim 12, line 2), change "bonded to a support" to -- bonded to the support --.

Signed and Sealed this

Seventh Day of July, 2009

JOHN DOLL
*Acting Director of the United States Patent and Trademark Office*